(12) United States Patent
Sankaralingam et al.

(10) Patent No.: US 9,741,705 B1
(45) Date of Patent: Aug. 22, 2017

(54) COMPACT ESD BOOTSTRAP CLAMP

(71) Applicant: Texas Instruments Incorporated, Dallas, TX (US)

(72) Inventors: Rajkumar Sankaralingam, Plano, TX (US); Aravind Appaswamy, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/015,435

(22) Filed: Feb. 4, 2016

(51) Int. Cl.
*H01L 27/02* (2006.01)

(52) U.S. Cl.
CPC ...... *H01L 27/0251* (2013.01); *H01L 27/0255* (2013.01); *H01L 27/0259* (2013.01); *H01L 27/0266* (2013.01)

(58) Field of Classification Search
CPC ............. H01L 27/0248; H01L 27/0251; H01L 27/0255; H01L 27/0259; H01L 27/0266; H01L 27/0288; H01L 27/0296
USPC ....... 327/309, 310, 313, 318, 321, 324, 327, 327/328, 419, 427, 432, 434, 436, 574, 327/581
See application file for complete search history.

(56) References Cited

U.S. PATENT DOCUMENTS

| | | | | | |
|---|---|---|---|---|---|
| 5,812,006 | A | * | 9/1998 | Teggatz | H03K 17/0822 327/309 |
| 5,963,407 | A | * | 10/1999 | Fragapane | H03K 17/0828 361/115 |
| 6,614,633 | B1 | * | 9/2003 | Kohno | H01L 27/0266 361/111 |
| 6,781,805 | B1 | * | 8/2004 | Urakawa | H01L 27/0251 361/111 |
| 2005/0088216 | A1 | * | 4/2005 | Arndt | H01L 23/62 327/325 |
| 2007/0014064 | A1 | * | 1/2007 | Souma | H03K 17/0822 361/91.7 |
| 2008/0258224 | A1 | * | 10/2008 | Hshieh | H01L 27/0255 257/356 |
| 2014/0085760 | A1 | * | 3/2014 | Lui | H01L 27/0255 361/91.5 |

* cited by examiner

*Primary Examiner* — William Hernandez
(74) *Attorney, Agent, or Firm* — Tuenlap D. Chan; Charles A. Brill; Frank D. Cimino (57) ABSTRACT

An integrated circuit with a boot strap clamp protecting an input/output transistor coupled to a bondpad where the boot strap clamp is comprised of a protection resistor coupled between the input/output transistor and the bondpad and a bootstrap clamp transistor coupled between the drain of the input/output transistor and the gate of the input/output transistor. An integrated circuit with a boot strap clamp protecting an input/output transistor coupled to a bondpad where the boot strap clamp is comprised of a protection resistor coupled between the input/output transistor and the bondpad and a bootstrap clamp diode coupled between the drain of the input/output transistor and the gate of the input/output transistor and a biasing resistor coupled between the gate and source of the input/output transistor.

21 Claims, 6 Drawing Sheets

COMPACT ESD BOOTSTRAP CLAMP

FIELD

This disclosure relates to the field of integrated circuits. More particularly, this disclosure relates to electrostatic discharge bootstrap clamp protection for integrated circuits.

BACKGROUND

Electrostatic discharge (ESD) is a continuing problem in the design, manufacture, and utilization of integrated circuits (ICs). A major source of ESD exposure is from the human body (described by the "Human Body Model", HBM). In this situation, a packaged IC acquires a charge when it is touched by a human who is electrostatically charged (e.g. from walking across a carpet). A charge of about 0.4 uC may be induced on a body capacitance of 100 pF, for example, leading to an electrostatic potential of 4 kV or more and discharge peak currents of several amperes to the IC for longer than 100 ns. A second source of ESD exposure is from charged metallic objects (described by the "Machine Model", MM), which is characterized by a greater capacitance, lower internal resistance and transients that have significantly higher peak current levels than a HBM ESD source. A third source of ESD exposure is due to the discharge to ground of stored charge on the integrated circuit itself (described by the "Charged Device Model", CDM), with rise times of less than 500 ps. The current flow during CDM is in the opposite direction than from the HBM and MM ESD sources. For all three sources of ESD exposure, both positive and negative polarity discharges may occur.

Figure 1A:
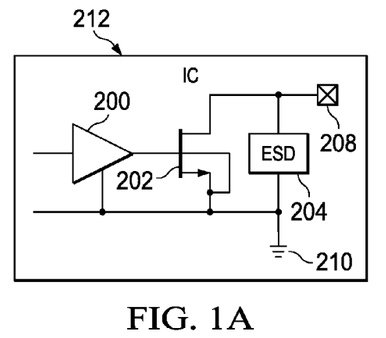
FIG. 1A is a circuit diagram with an input/output transistor protected by an ESD circuit.
Figure 1B:
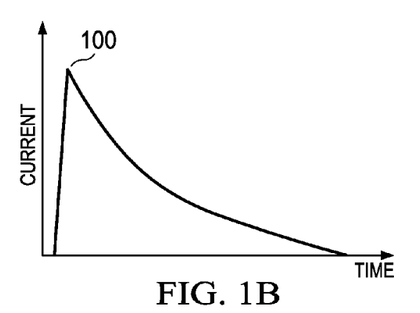
FIG. 1B is a graph of the current generated during an ESD strike as a function of time.

A current vs time plot of a typical HBM ESD event is shown in FIG. 1B. The current 100 (or voltage) rises very rapidly. An ESD circuit 204 connected in parallel to an input/output transistor 202 of an integrated circuit 212 (FIG. 1A) and ground 210 detects the ESD event and turns on to rapidly shorts excess charge to ground 210 before it can damage the integrated circuit (IC) 212. A driver circuit 200 included in the IC 212 drives the gate of the input/output (I/O) transistor 202.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit with a boot strap clamp protecting an input/output transistor coupled to a bondpad where the boot strap clamp is comprised of a protection resistor coupled between the input/output transistor and the bondpad and a bootstrap clamp transistor coupled between the drain of the input/output transistor and the gate of the input/output transistor. An integrated circuit with a boot strap clamp protecting an input/output transistor coupled to a bondpad where the boot strap clamp is comprised of a protection resistor coupled between the input/output transistor and the bondpad and a bootstrap clamp diode coupled between the drain of the input/output transistor and the gate of the input/output transistor and a biasing resistor coupled between the gate and source of the input/output transistor.

DETAILED DESCRIPTION OF EXAMPLE EMBODIMENTS

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a methodology in accordance with the present disclosure.

In some cases an (I/O) transistor 202 that is connected to a bondpad 208 may be damaged by an ESD event (FIG. 1A). An ESD event on the bond pad 208 causes the voltage on the drain (Vd) of the I/O transistor 202 to rise rapidly. This may result in a voltage difference between the drain and source (Vds) on the I/O transistor 202 that is larger than the I/O transistor's 202 failure threshold causing the I/O transistor 202 to fail.

Figure 2:
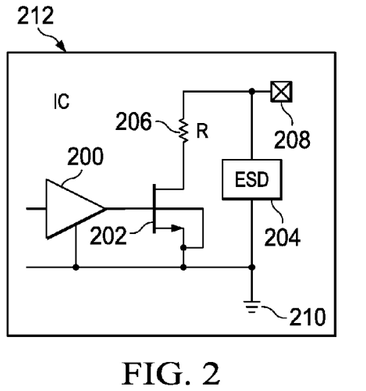
FIG. 2 is a circuit diagram with an input/output transistor protected by an ESD circuit and a series resistor.

One method of providing additional ESD protection is to insert a bootstrap clamp 206 between the drain of the I/O transistor 202 and the bond pad 208 as is shown in FIG. 2. The bootstrap clamp resistor 206 in some cases may become large to provide adequate ESD protection. A large resistance in series between the I/O transistor 202 and the bondpad 208 causes degradation of the performance of the IC 212.

The resistance required to protect the I/O transistor 202 may be calculated using Equation (1) below where R is the resistance of the bootstrap clamp resistor 206, $V_{ESD}$ is the maximum voltage of the ESD circuit 204, $Vd_{MAX}$ is the maximum drain voltage the I/O transistor 202 can tolerate without being damaged and $I_{MAX}$ is the maximum current the I/O transistor 202 can tolerate without being damaged in a powered off state.

$$R = \frac{V_{ESD} - Vd_{MAX}}{I_{MAX}} \qquad \text{Eq. (1)}$$

Figure 3:
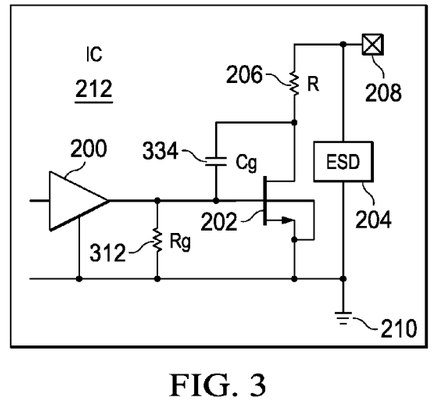
FIG. 3 is a circuit diagram with an input/output transistor protected by an ESD circuit, a series resistor, a pullup capacitor, and a second pulldown resistor.

If $I_{MAX}$ is small, the protection resistor 206 becomes excessively large. In such cases, another method to provide additional ESD protection to the I/O transistor 202 is to add pullup capacitance. One conventional circuit is illustrated in FIG. 3. This circuit consists of a pullup capacitor 334 connected between the drain terminal and gate terminal of the I/O transistor 202 plus a biasing resistor 312 connected between the gate terminal of the I/O transistor 202 and the source terminal 210. When an ESD event causes Vd of the I/O transistor 202 to rise, the pullup capacitor 334 causes the voltage on the gate terminal (Vg) of the I/O transistor 202 to rise turning the I/O transistor 202 on. With the I/O transistor 202 turned on, some ESD current flows through the bootstrap clamp resistor 206 and the I/O transistor 202 to the grounded source terminal 210 preventing damage. This avoids the bootstrap clamp resistor 206 from becoming too large.

The biasing resistor 312 sets the time constant of the capacitance-resistance (RC) circuit formed by the bootstrap clamp capacitor 334 and bootstrap clamp resistor 312. The time constant may be adjusted using the biasing resistor 312 to ensure the I/O transistor 202 stays on until the ESD event has fully passed.

The resistance required to protect the I/O transistor 202 for the circuit in FIG. 3 may be calculated using Equation (2) below where R is the resistance of the protection resistor 206, $V_{ESD}$ is the trigger voltage of the ESD circuit 204, $Vd_{MAX}$ is the maximum drain voltage the I/O transistor 202 can tolerate and $I_{SAT}$ is the saturation current the I/O transistor 202.

$$R = \frac{V_{ESD} - Vd_{MAX}}{I_{SAT}} \qquad \text{Eq. (2)}$$

When $I_{SAT}$ of the I/O transistor 202 is low, the capacitor may become large and may occupy a large area. In addition, this RC circuit must be custom designed taking into account the output resistance of the driver circuit 200. Also, the added capacitance could cause undesirable tradeoffs between ESD performance and functional requirements.

Figure 4A:
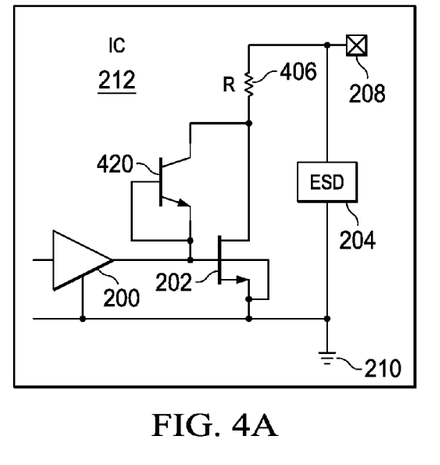
FIG. 4A is a circuit diagram with an input/output transistor protected by an ESD circuit, a bootstrap clamp resistor, and an embodiment bootstrap clamp transistor according to principles of the disclosure.

An embodiment compact ESD bootstrap clamp which utilizes a bootstrap clamp transistor 420 coupled between the drain terminal and gate terminal of the I/O transistor 202 is illustrated in FIG. 4A. An ESD circuit 204 is connected between the bond pad 208 and source terminal 210. A driver circuit 200 controls the voltage on the gate terminal of the input/output (I/O) transistor 202. The drain terminal of the I/O transistor 202 is connected through bootstrap clamp resistor 406 to the bondpad 208. The embodiment bootstrap clamp transistor 420 provides ESD protection to the I/O transistor 202 through a smaller series protection resistance with a small increase in area while being transparent to functional requirements.

Figure 4B:
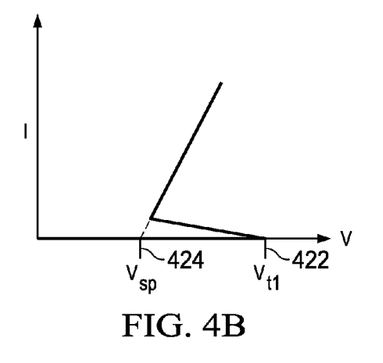
FIG. 4B is a graph of the drain voltage versus the drive current through the embodiment bootstrap clamp transistor in FIG. 4

The operation of the bootstrap clamp transistor 420 during an ESD strike is illustrated in FIG. 4B. During a positive voltage ESD strike, the voltage on the collector of the bootstrap clamp NPN bipolar transistor 420 is raised until the reverse biased collector/base NP bootstrap clamp diode begins to conduct current 422 causing the collector voltage to drop 424. This collector base current causes the base voltage to rise forward biasing the emitter/base junction of the bootstrap clamp bipolar transistor 420. When this occurs the bipolar bootstrap clamp transistor 420 turns on and current flows through the bootstrap clamp transistor 420 causing the gate voltage of the I/O transistor 202 to rise and the I/O transistor 202 to turn on. This in turn would allow the series protection resistor 406 to be small. If the bootstrap clamp transistor is chosen such that it has a breakdown larger than pin operating voltage then the clamp addition would be transparent to functional requirements.

The bootstrap clamp transistor 420 of this embodiment may be significantly smaller than the capacitor 334 utilized in conventional ESD bootstrap clamp circuits. In this embodiment the size of the bootstrap clamp transistor 420 may depend upon the output resistance of the driver circuit 200.

Figure 5A:
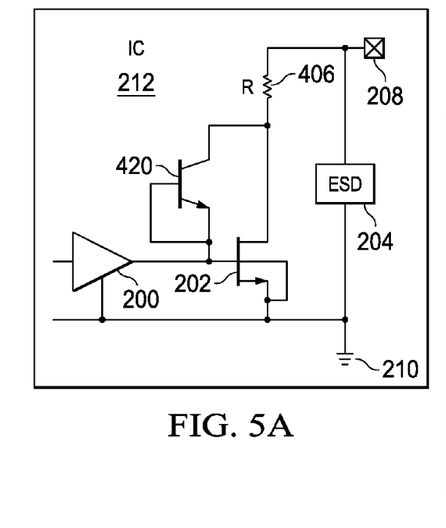
FIGS. 5A, 5B, 5C, 5D are circuit diagrams of embodiment bootstrap clamp circuit options.
Figure 5B:
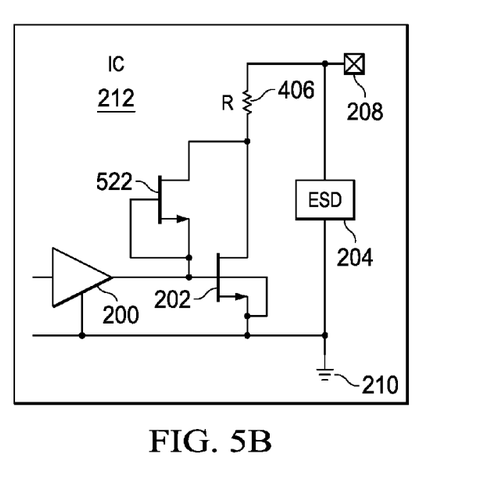
Figure 5C:
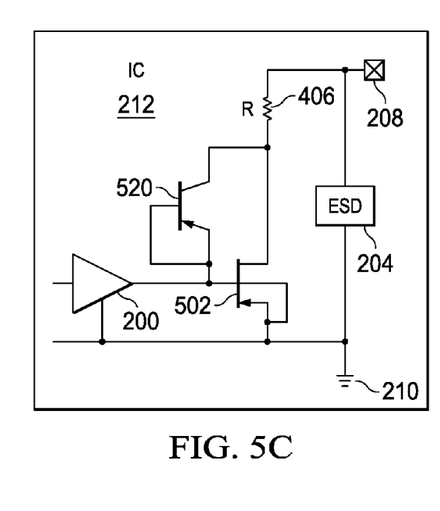
Figure 5D:
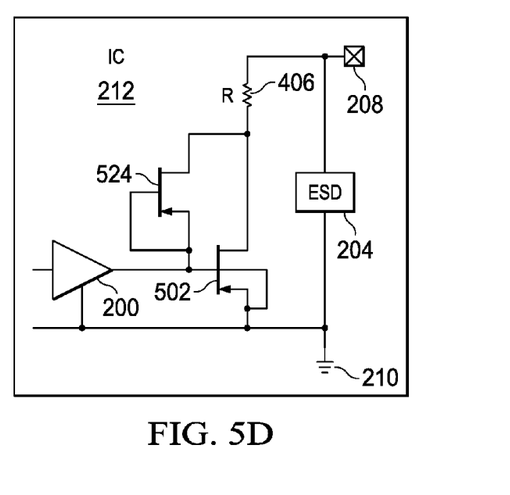

For purposes of illustration, an NMOS I/O transistor 202 and an NPN bipolar bootstrap clamp transistor 420 are used in FIGS. 4 and 5A. The I/O transistor can be any kind (PMOS, NPN, PHP, JFET, etc) while the bootstrap clamp can also be any breakdown device (transistor or diode) to achieve the desired characteristics. Some example combinations are listed in FIGS. 5B, 5C, and 5D. In each case the I/O transistor is coupled between the protection resistor 406 and ground and the bootstrap clamp transistor is coupled between the drain terminal and gate terminal of the I/O transistor.

Figure 6:
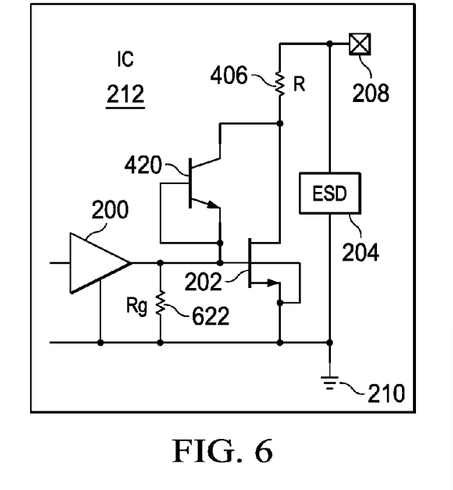
FIG. 6 is a circuit diagram with an input/output transistor protected by an ESD circuit, a bootstrap clamp resistor, and an embodiment bootstrap clamp transistor plus a biasing pulldown resistor according to principles of the disclosure.

A second embodiment is illustrated in FIG. 6. In this embodiment a biasing resistor 622 is connected between the gate terminal of the I/O transistor 202 and the source terminal 210. Adding this biasing resistor 622 provides more flexibility in the design of the bootstrap clamp transistor 420. This enables the designer to design one bootstrap clamp circuit and use one design for all I/O transistors on the integrated circuit 212 instead of having to design a different bootstrap clamp for each driver output resistance.

Figure 7A:
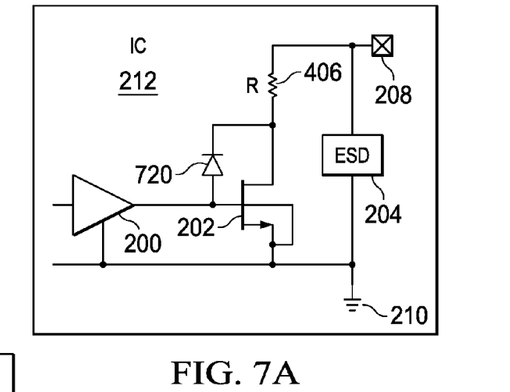
FIGS. 7A and 7B are circuit diagrams of an input/output transistor protected by an ESD circuit, a bootstrap clamp resistor, and an embodiment bootstrap clamp diode according to principles of the disclosure.
Figure 7B:
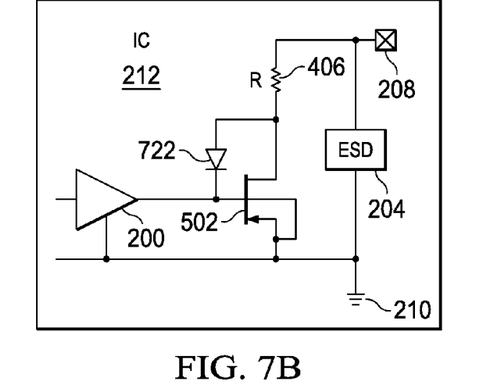
Figure 7C:
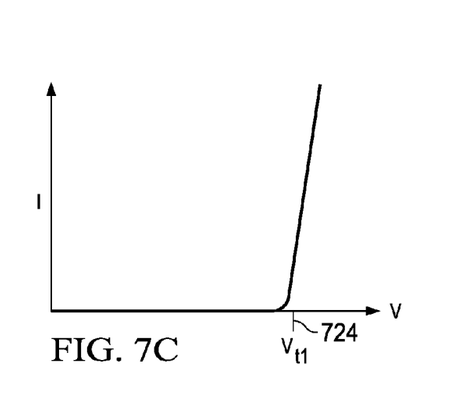
FIG. 7C is a graph of the diode breakdown voltage of an embodiment bootstrap clamp diode.

A third embodiment is illustrated in FIGS. 7A, 7B, and 7C. This embodiment uses an NP bootstrap clamp diode 720 connected between the drain terminal and the gate terminal of an NMOS I/O transistor 202. As shown in the graph in FIG. 7C of the reverse biased bootstrap clamp diode current 724 versus the drain voltage of the I/O transistor 202, during a positive voltage ESD strike the drain voltage of the I/O transistor 202 rises until the breakdown voltage 724 of the bootstrap clamp diode 720 is reached. The current then rapidly rises increasing the voltage on the gate terminal of the I/O transistor 202 and turning the I/O transistor 202 on. ESD current through the I/O transistor 202 to ground helps protecting the IC 212 from damage using a smaller protection resistor.

As shown in FIG. 7B, in a similar manner, a PN bootstrap clamp diode 722 may be used to protect a PMOS I/O transistor 502.

Figure 8A:
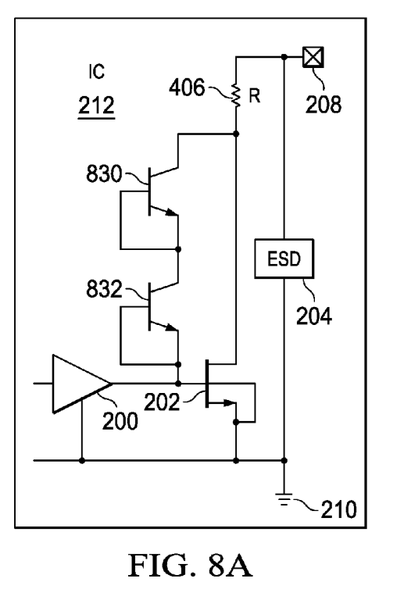
FIGS. 8A and 8B are circuit diagrams of circuits with an input/output transistor protected by an ESD circuit, and by two embodiment bootstrap clamp transistors connected in series, according to principles of the disclosure.

A fourth embodiment is illustrated in FIG. 8A. When the normal operating voltage of the I/O transistor 202 is greater than the turn on voltage of the bootstrap clamp transistor 830, two bootstrap clamp transistors, 830 and 832, may be connected in series so that the turn on voltage of the bootstrap clamp circuit is sufficiently high so as not to interfere with normal operation of the I/O transistor 202. In this embodiment the bootstrap clamp consists of two bootstrap clamp transistors, 830 and 832, connected in series between the drain terminal and the gate terminal of the I/O transistor 202. This prevents the bootstrap clamp circuit from interfering with normal operation of the I/O transistor 202.

Although two bootstrap clamp transistors in series are used for illustration, any number of boot strap clamp transistors in series may be used to achieve whatever higher bootstrap clamp circuit turn on voltage is needed.

Figure 8B:
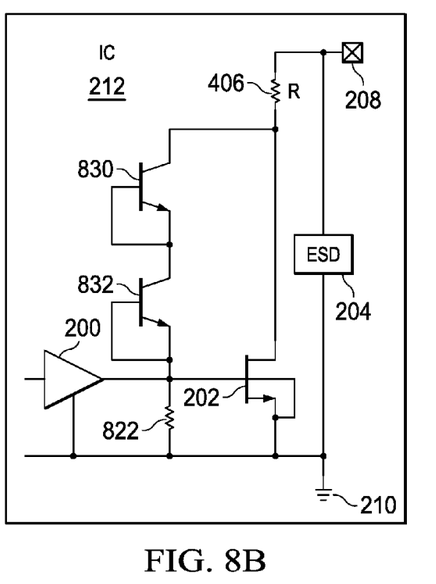

As shown in FIG. 8B, a biasing resistor 822 may be added between the gate terminal of the I/O transistor 202 and source terminal to provide more flexibility in the design of the bootstrap clamp circuit. This enables the designer to design one bootstrap clamp circuit and use that one design for all I/O transistors on the integrated circuit instead of having to design a different bootstrap clamp for each driver output resistance.

Figure 9A:
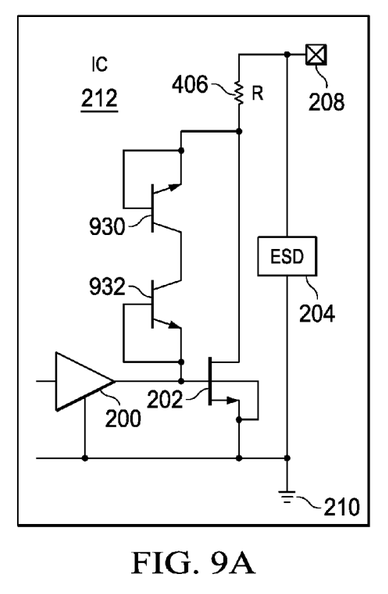
FIGS. 9A and 9B are circuit diagrams of circuits with an input/output transistor protected by an ESD circuit, and by two embodiment bootstrap clamp transistors connected back-to-back in series, according to principles of the disclosure.

A fifth embodiment is illustrated in FIG. 9A. In this embodiment two bootstrap clamp transistors, 930 and 932, are added back-to-back in series between the drain terminal and the gate terminal of the I/O transistor 202. This embodiment enables the bootstrap clamp transistors, 930 and 932, to protect the I/O transistor 202 in the event of either a positive or a negative ESD event. This embodiment enables the gate terminal of the I/O transistor to rise above the drain terminal by more than a forward diode voltage drop when necessary for functional reasons.

In the event of a positive ESD strike on the bondpad 208 the emitter/base junction of the first bipolar bootstrap clamp transistor 930 becomes forward biased and the ESD current flows directly to the reverse biased collector/base junction of the second bipolar bootstrap clamp transistor 932. As discussed in reference to FIG. 4, this transistor 932 then turns on and raises the voltage on the gate of the I/O transistor 202 causing it to turn on and short the positive ESD current to ground.

A negative ESD strike on the bondpad 208 reverse biases the base/collector junction of the first bipolar bootstrap clamp transistor 930 until breakdown voltage is reached and current begins to flow to the forward biased collector/base junction of the second bipolar bootstrap clamp transistor 832. Current flows through this forward biased junction to the gate of the I/O transistor 202.

Figure 9B:
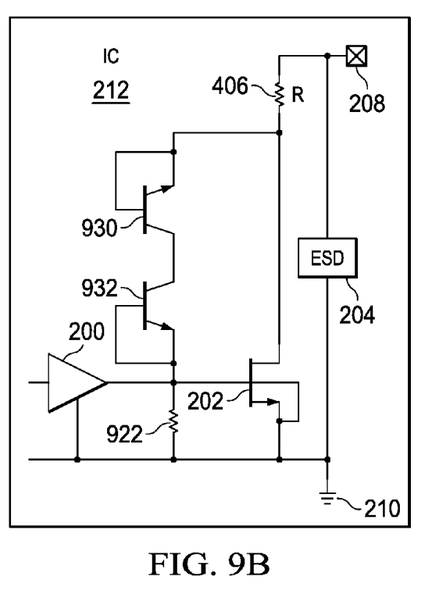

As shown in FIG. 9B, a biasing resistor 922 may be added between the gate terminal of the I/O transistor 202 and the source terminal 210 to aid in the design of the bootstrap clamp circuit. This enables the designer to design one bootstrap clamp circuit and use that one design for all I/O transistors on the integrated circuit instead of having to design a different bootstrap clamp for each driver output resistance.

Two bootstrap clamp transistors back-to-back in series are used to provide ESD protection against both positive and negative ESD strikes. For I/O transistors that operate at higher voltages, any number of bootstrap clamp devices may be used (a stack of the same kind of devices or a combination of different kinds of devices). For example, two bootstrap clamp transistors may be connected in series and then connected back-to-back in series with another two bootstrap clamp transistors connected in series to provide both positive and negative ESD protecting with a higher bootstrap clamp turn on voltage.

Figure 10:
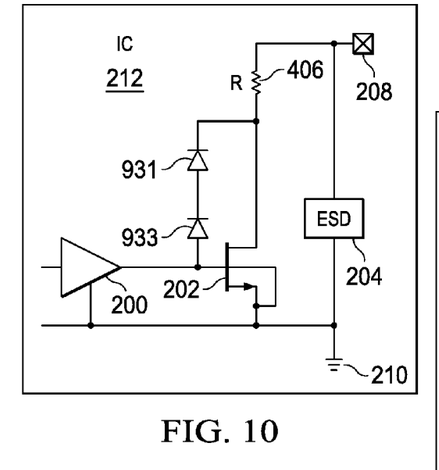
FIG. 10 is a circuit diagram of an integrated circuit with an input/output transistor protected by an ESD circuit, and by two embodiment bootstrap clamp diodes connected in series, according to principles of the disclosure.

As shown in FIG. 10, if the drain terminal-to-source terminal breakdown voltage of the I/O transistor 202 is higher than the reverse diode breakdown of the bootstrap clamp diode 931, another bootstrap clamp diode 933 may be added in series to increase the turn on voltage of the bootstrap clamp circuit. Although two bootstrap clamp diodes, 931 and 933, are shown any number of bootstrap clamp diodes may be connected in series to achieve a desired bootstrap clamp circuit turn on voltage.

Figure 11:
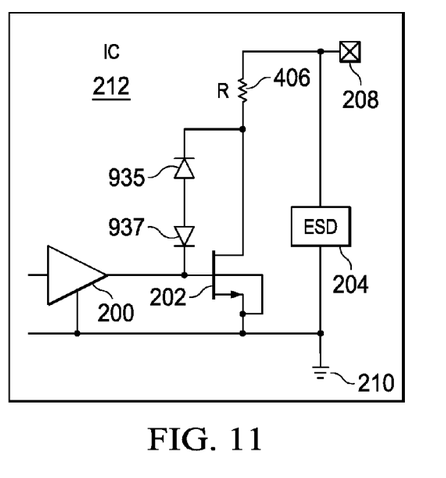
FIG. 11 is a circuit diagram of an integrated circuit with an input/output transistor protected by an ESD circuit, and by two embodiment bootstrap clamp diodes connected back-to-back in series, according to principles of the disclosure.

As shown in FIG. 11, two bootstrap clamp diodes, 935 and 937, may be connected back-to-back in series between the drain terminal and the gate terminal of the I/O transistor 202 to provide protection against either a positive or negative ESD strike.

In the event of a positive ESD strike bootstrap clamp diode 935 is forward biased and bootstrap clamp diode 937 is reverse biased. In the event of a negative ESD strike bootstrap clamp diode 935 is forward biased and bootstrap clamp diode 937 is reverse biased. In both cases the voltage on the drain of the I/O transistor 202 raises until the reverse biased diode breakdown voltage is reached. When the reverse biased diode breakdown voltage is reached, current is conducted to the gate terminal of the I/O transistor 202.

In another embodiment, the I/O transistor 202 may be large and may be able to conduct a significant amount of current. In this case an embodiment bootstrap clamp may be designed to self-protect these strong I/O transistors during an ESD event without the aid of the ESD protection circuit 214. Example self-protect circuits are illustrated in FIGS. 12A, 12B, 12C, and 12D. To determine if the I/O transistor 202 can be self-protected without the aid of ESD circuit 204, a calculation may be performed to determine if the bootstrap clamp circuit can raise the voltage Vgs on the gate terminal of the I/O transistor during an ESD strike high enough for the I/O transistor 202 to turn on and safely conduct the ESD current without being damaged.

A linear safe operating area (SOA) boundary 960 (FIG. 13) for the I/O transistor 202 is formed by drawing a line on the drive current Ids 962 versus drain voltage Vds 964 graph family of curves. Each of the family of curves 972 and 974 is Ids for a different gate voltage Vgs. The SOA boundary is defined by drawing a straight line from BVdss 962 which is the diode breakdown voltage of the drain terminal with the gate terminal grounded, to the BVdii 968 point on the drive current Ids curve with the maximum gate voltage or (Vgs-max) 976. This BVdii 968 point is the voltage on the drain terminal at which the parasitic bipolar transistor turns on with the gate terminal at maximum voltage (Vgs-max). The I/O transistor 202 operates safely when Vgs and Vds are less than the SOA boundary 960.

Figure 13:
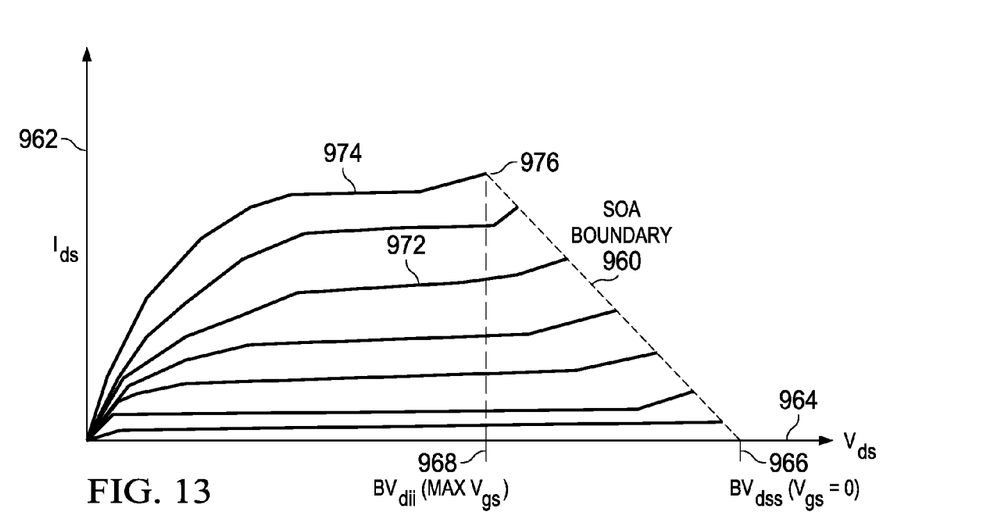
FIG. 13 is a plot of drive current versus drain voltage illustrating the safe operating boundary of a weak input/output transistor.

For a linear SOA boundary the maximum safe gate voltage (MSVgs) of the I/O transistor 202 may be calculated using Equation (3) below. BVdss is the breakdown voltage of the drain terminal diode with the gate terminal grounded, BVii is the drain voltage at which the parasitic bipolar transistor turns on when the gate voltage is maximum (Vgs-max), and Vdmax is the drain voltage at which the I/O transistor 202 fails.

$$MSVgs = \frac{(BVdss - Vdmax)Vgs - \max}{BVdss - BVdii + Vgs - \max} \quad \text{Eq. (3)}$$

MSVgs calculated in Equation (3) may be plugged into Equation (4) below to calculate the maximum safe drive current (MSIds) the I/O transistor 202 can conduct. $\epsilon_{ox}$ is the dielectric constant of the gate oxide of the weak I/O transistor 202, $\epsilon_0$ is the dielectric constant of vacuum, $\mu$ is the electron mobility in silicon, and $t_{ox}$ is the thickness of the gate oxide.

$$MSIds = \frac{\epsilon_{ox}\epsilon_o}{2t_{ox}} \mu (MSV_{gs})^2 \quad \text{Eq. (4)}$$

Figure 12A:
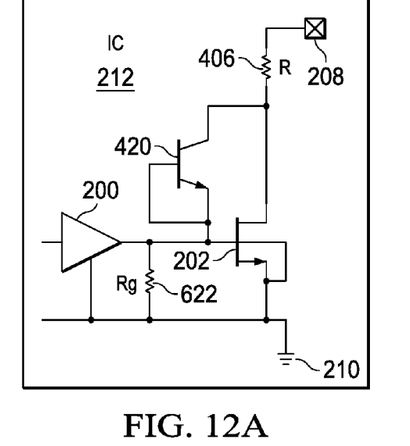
FIGS. 12A, 12B, and 12C are circuit diagrams of circuits with an input/output transistor protected with bootstrap clamp transistors according to principles of the disclosure.
Figure 12B:
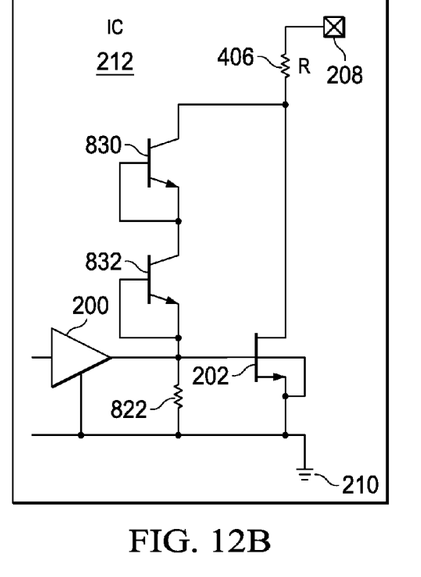
Figure 12C:
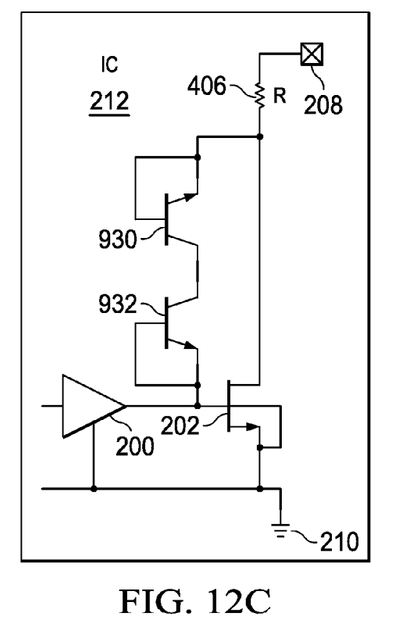
Figure 12D:
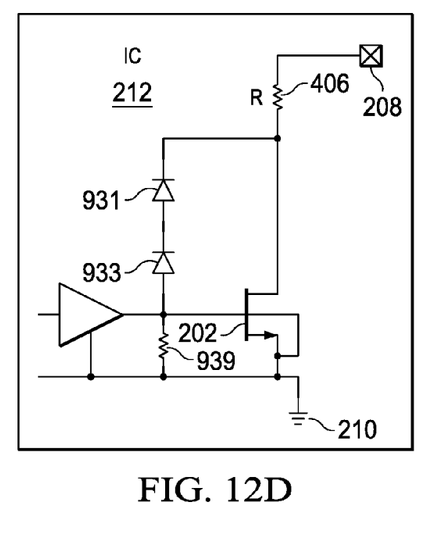
FIG. 12D is a circuit diagram of an integrated circuit with an input/output transistor protected with a bootstrap clamp diode according to principles of the disclosure.

If MSIds calculated in the Equation (4) above is higher than the current generated during an ESD strike, the ESD circuit may be eliminated as is shown in the illustrative example circuits in FIGS. 12A, 12B, 12C, and 12D. In these examples, the embodiment bootstrap clamp circuits are sufficient to protect the I/O transistor 202 without the additional ESD circuit 204. If the I/O transistor is not big enough to self-protect, MSIds can be used to calculate necessary protection resistance to work in conjunction with an explicit ESD cell according to Equation (2). The circuit in FIG. 12A is the same as the circuit FIG. 6 with the ESD circuit 204 omitted. The circuit in FIG. 12B is the same as the circuit FIG. 8B with the ESD circuit 204 omitted. The circuit in FIG. 12C is the same as the circuit in FIG. 9B with the ESD circuit 204 omitted. The circuit in FIG. 12D is the same as the circuit in FIG. 10 with the ESD circuit 204 omitted and with bootstrap clamp resistor 939 added.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An integrated circuit, comprising:
   a first transistor having a drain terminal, a source terminal, and a gate terminal;
   a bondpad coupled with the drain terminal of the first transistor; and
   a second transistor coupled between the drain terminal and the gate terminal of the first transistor, wherein:
      the second transistor includes a first bipolar transistor coupled in series with at least a second bipolar transistor,
      a collector terminal of the first bipolar transistor is coupled to the drain terminal of the first transistor,
      an emitter terminal of the first bipolar transistor is coupled to a collector terminal of the second bipolar transistor, and
      an emitter terminal of the second bipolar transistor is coupled to the gate terminal of the first transistor.

2. The integrated circuit of claim 1, further comprising a resistor coupled between the gate terminal of the first transistor and the source terminal.

3. The integrated circuit of claim 1, further comprising an electrostatic discharge (ESD) circuit coupled between the bondpad and the source terminal.

4. The integrated circuit of claim 1, wherein the first bipolar transistor includes a first NPN bipolar transistor, the second bipolar transistor includes a second NPN bipolar transistor, and the first transistor includes an NMOS transistor.

5. The integrated circuit of claim 1, wherein the first bipolar transistor includes a first PNP bipolar transistor, the second bipolar transistor includes a second PNP bipolar transistor, and the first transistor includes a PMOS transistor.

6. An integrated circuit, comprising:
   a first transistor having a drain terminal, a source terminal, and a gate terminal;
   a bondpad coupled with the drain terminal of the first transistor; and
   a second transistor coupled between the drain terminal and the gate terminal of the first transistor, wherein:
      the second transistor includes a first MOS transistor in series with at least a second MOS transistor,
      the drain terminal of the first MOS transistor is coupled to the drain terminal of the first transistor,
      the source terminal of the first MOS transistor is coupled to a drain terminal of the second MOS transistor, and
      the source terminal of the second MOS transistor is coupled to the gate terminal of the first transistor.

7. The integrated circuit of claim 6, further comprising a resistor coupled between the gate terminal and the source terminal of the first transistor.

8. The integrated circuit of claim 6 further comprising an electrostatic discharge (ESD) circuit coupled between the bondpad and the source terminal of the first transistor.

9. The integrated circuit of claim 6, wherein the first MOS transistor includes a first NMOS transistor, and the second MOS transistor includes a second NMOS transistor, and the first transistor includes a third NMOS transistor.

10. The integrated circuit of claim 6, wherein the first MOS transistor includes a first PMOS transistor, and the second MOS transistor includes a second PMOS transistor, and the first transistor includes a third PMOS transistor.

11. An integrated circuit, comprising:
   a first transistor having a drain terminal, a source terminal, and a gate terminal;

a bondpad coupled with the drain terminal of the first transistor; and a second transistor coupled between the drain terminal and the gate terminal of the first transistor, wherein:
the second transistor includes a first bipolar transistor in series with at least a second bipolar transistor,
a collector terminal of the first bipolar transistor is coupled to a collector terminal of the second bipolar transistor,
an emitter terminal of the first bipolar transistor is coupled to the drain terminal of the first transistor, and
an emitter terminal of the second bipolar transistor is coupled to the gate terminal of the first transistor.

12. The integrated circuit of claim 11 further comprising a resistor coupled between the gate terminal and the source terminal.

13. The integrated circuit of claim 11 further comprising an ESD circuit coupled between the bondpad and the source terminal.

14. The integrated circuit of claim 11, wherein the first bipolar transistor includes a first NPN bipolar transistor, the second bipolar transistor includes a second NPN bipolar transistor, and the first transistor includes an NMOS transistor.

15. The integrated circuit of claim 11, wherein the first bipolar transistor includes a first PNP bipolar transistor, and the second bipolar transistor includes a second PNP bipolar transistor, and the first transistor includes a PMOS transistor.

16. An integrated circuit, comprising:
a first transistor having a drain terminal, a source terminal, and a gate terminal;
a bondpad coupled with the drain terminal of the first transistor; and
a second transistor coupled between the drain terminal and the gate terminal of the first transistor, wherein:
the first transistor includes an NMOS transistor,
the second transistor includes an NPN bipolar transistor,
a collector terminal of the NPN bipolar transistor is coupled to the drain terminal of the NMOS transistor, and
an emitter terminal of the NPN bipolar transistor is coupled to the gate terminal of the NMOS transistor.

17. The integrated circuit of claim 16, further comprising a resistor coupled between the gate terminal and the source terminal.

18. The integrated circuit of claim 16, further comprising an ESD circuit coupled between the bondpad and the source terminal.

19. An integrated circuit, comprising:
a first transistor having a drain terminal, a source terminal, and a gate terminal;
a bondpad coupled with the drain terminal of the first transistor; and
a second transistor coupled between the drain terminal and the gate terminal of the first transistor, wherein:
the first transistor includes an PMOS transistor,
the second transistor includes a PNP bipolar transistor,
a collector terminal of the PNP bipolar transistor is coupled to the drain terminal of the PMOS transistor, and
an emitter terminal of the PNP bipolar transistor is coupled to the gate terminal of the PMOS transistor.

20. The integrated circuit of claim 19, further comprising a resistor coupled between the gate terminal and the source terminal.

21. The integrated circuit of claim 19, further comprising an ESD circuit coupled between the bondpad and the source terminal.

* * * * *